US012224552B2

(12) United States Patent
Noguchi et al.

(10) Patent No.: US 12,224,552 B2
(45) Date of Patent: Feb. 11, 2025

(54) OPTICAL MODULE

(71) Applicant: CIG Photonics Japan Limited, Kanagawa (JP)

(72) Inventors: Daisuke Noguchi, Tachikawa (JP); Hiroshi Yamamoto, Inagi (JP)

(73) Assignee: CIG PHOTONICS JAPAN LIMITED, Kanagawa (JP)

( * ) Notice: Subject to any disclaimer, the term of this patent is extended or adjusted under 35 U.S.C. 154(b) by 551 days.

(21) Appl. No.: 17/592,606

(22) Filed: Feb. 4, 2022

(65) Prior Publication Data

US 2022/0278500 A1 Sep. 1, 2022

(30) Foreign Application Priority Data

Mar. 1, 2021 (JP) .................................. 2021-031654

(51) Int. Cl.

| | |
|---|---|
| *H01S 3/04* | (2006.01) |
| *H01S 5/02212* | (2021.01) |
| *H01S 5/0231* | (2021.01) |
| *H01S 5/02315* | (2021.01) |
| *H01S 5/02345* | (2021.01) |
| *H01S 5/0239* | (2021.01) |
| *H01S 5/062* | (2006.01) |
| *H01S 5/024* | (2006.01) |

(Continued)

(52) U.S. Cl.
CPC ...... *H01S 5/02345* (2021.01); *H01S 5/02212* (2013.01); *H01S 5/0231* (2021.01); *H01S 5/02315* (2021.01); *H01S 5/0239* (2021.01); *H01S 5/06226* (2013.01); *H01S 5/02415* (2013.01); *H01S 5/0265* (2013.01); *H01S 5/0427* (2013.01)

(58) Field of Classification Search
CPC ............. H01S 5/02345; H01S 5/02212; H01S 5/0231; H01S 5/02315; H01S 5/0239; H01S 5/06226; H01S 5/02415; H01S 5/0265; H01S 5/042
See application file for complete search history.

(56) References Cited

U.S. PATENT DOCUMENTS

2018/0310397 A1* 10/2018 Noguchi .............. H05K 1/0274
2019/0069395 A1* 2/2019 Noguchi ............... H05K 1/113
(Continued)

FOREIGN PATENT DOCUMENTS

JP 2011-108939 A 6/2011

*Primary Examiner* — Kinam Park
(74) *Attorney, Agent, or Firm* — MATTINGLY & MALUR, PC (57) ABSTRACT

An optical module includes: amounting substrate; a support block on which the mounting substrate is mounted; and a stem having a support surface to support the support block, the stem having a pedestal portion with a tip face in a protruding direction and with an upper surface spreading along the protruding direction; a relay board on the upper surface; a connection block fixed to the tip face; and wires connecting the support block and the mounting substrate to the connection block. The connection block has a surface made of a conductor. The connection block has a first bonding surface facing the same direction as the tip face of the pedestal portion and a second bonding surface facing the same direction as the upper surface. The wires include first and second wires having their ends bonded to the first and second bonding surface, respectively.

19 Claims, 8 Drawing Sheets

(51) Int. Cl.
 *H01S 5/026* (2006.01)
 *H01S 5/042* (2006.01)

(56) References Cited

U.S. PATENT DOCUMENTS

| | | | |
|---|---|---|---|
| 2021/0076500 A1* | 3/2021 | Noguchi | H05K 1/14 |
| 2022/0173571 A1* | 6/2022 | Noguchi | H01S 5/02212 |
| 2022/0201863 A1* | 6/2022 | Noguchi | H01S 5/026 |

* cited by examiner

OPTICAL MODULE

CROSS-REFERENCE TO RELATED APPLICATION

The present application claims priority from Japanese patent application JP2021-031654 filed on Mar. 1, 2021, the contents of which are hereby incorporated by reference into this application.

BACKGROUND

1. Field

This disclosure relates to an optical module.

2. Description of the Related Art

Small optical modules are required to have better heat dissipation and higher frequency characteristics. A transistor outline can (TO-CAN) package is configured to transmit electrical signals to a semiconductor optical device using lead pins that penetrate eyelets at ground potential (JP2011-108939A). A substrate on which the semiconductor optical device is mounted is on a support block.

Enhancing the ground of the support block can improve the high frequency characteristics. For example, a pedestal that protrudes integrally from the eyelet can be electrically connected to the support block with wires. However, the pedestal is difficult to fabricate into a shape suitable for bonding.

SUMMARY

This disclosure aims to improve high frequency characteristics by stable wire bonding.

An optical module includes: a photoelectric device configured to convert an optical signal and an electrical signal at least from one to another; a mounting substrate on which the photoelectric device is mounted; a support block on which the mounting substrate is mounted and at least a surface of which is made of a conductor; and a stem having a support surface to support the support block, the stem having a pedestal portion projecting integrally from the support surface, the pedestal portion having a tip face in a protruding direction and an upper surface spreading along the protruding direction; a relay board mounted on the upper surface of the pedestal portion; a connection block fixed to the tip face of the pedestal portion; and some wires, each of the wires connecting a corresponding one of the support block and the mounting substrate to the connection block. The connection block has a surface at least part of which is made of a conductor. The connection block has a first bonding surface facing the same direction as the tip face of the pedestal portion and a second bonding surface facing the same direction as the upper surface. The wires include at least one first wire having one end bonded to the first bonding surface and at least one second wire having one end bonded to the second bonding surface.

The connection block can secure a surface for wire bonding, thereby enabling stable wire bonding.

DETAILED DESCRIPTION

The embodiments of the present invention will be described in detail and concretely with reference to the drawings below. In all the figures, the parts with the same sign have the same or equivalent functions, and the repetition of the description is omitted. The size of the figures does not necessarily correspond to the magnification.

First Embodiment

Figure 1:
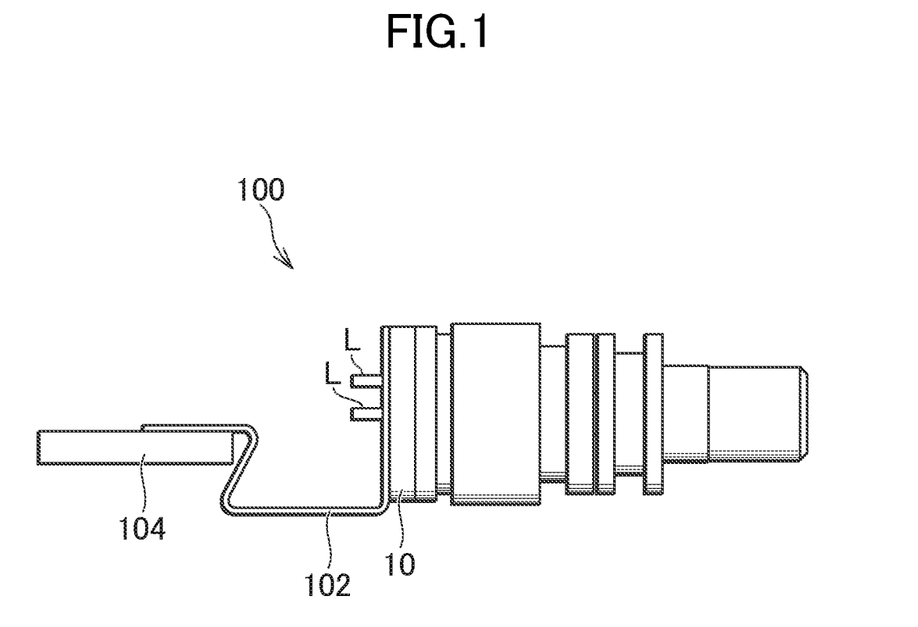
FIG. 1 is a perspective view of an optical module according to a first embodiment.

FIG. 1 is a perspective view of an optical module according to a first embodiment. The optical module 100 is a TO-CAN (Transistor Outline-Can) type optical module, and includes a transmitter optical sub-assembly (TOSA) equipped with a light emitting device, a receiver optical sub-assembly (ROSA) equipped with a light receiving device, or a bidirectional optical sub-assembly (BOSA) equipped with both the light emitting device and the light receiving device. The optical module 100 has a flexible printed circuit board (FPC) 102, which is connected to a printed circuit board (PCB) 104. The optical module 100 has a stem 10.

[Stem/Pedestal]

Figure 2:
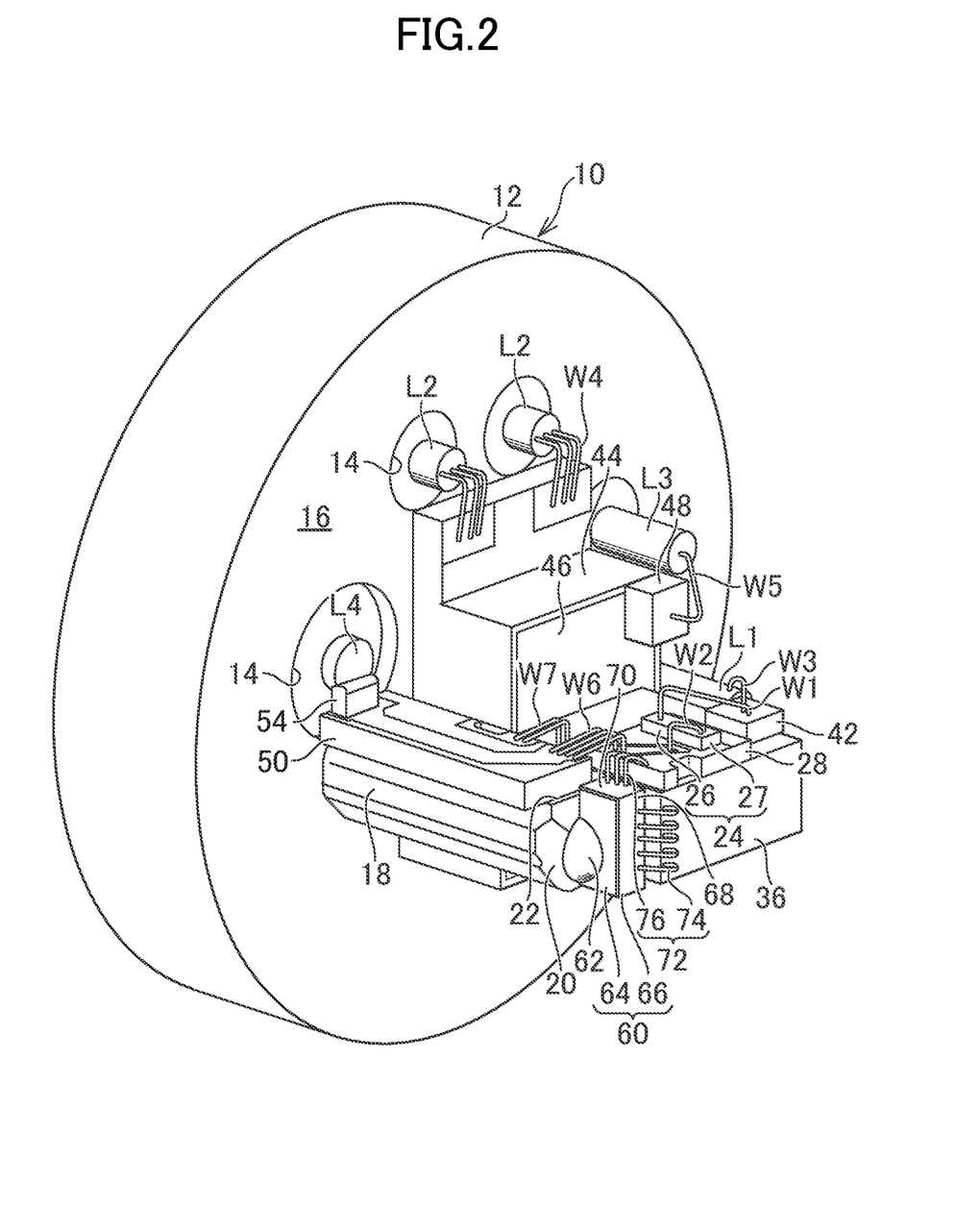
FIG. 2 is a perspective view of a stem and electronic components mounted on it.
Figure 3:
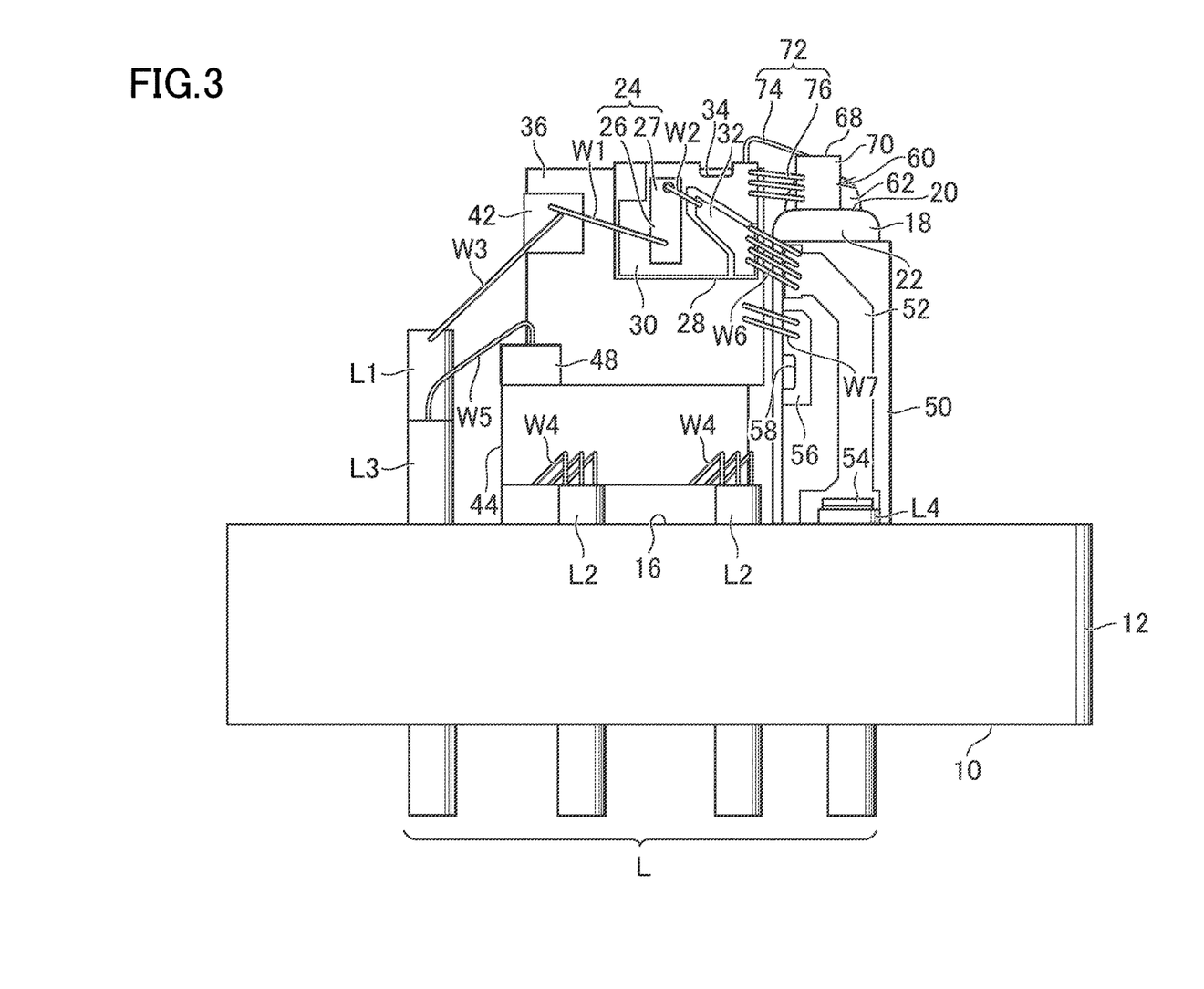
FIG. 3 is a plan view of the stem and the electronic components mounted on it.

FIG. 2 is a perspective view of the stem 10 and electronic components mounted on it. FIG. 3 is a plan view of the stem 10 and the electronic components mounted on it. The stem 10 is made of a conductor such as metal. The stem 10 includes an eyelet 12. The eyelet 12 has some through holes 14 that penetrate between front and back surfaces in a thickness direction. The stem 10 may have another shaped portion such as a square, instead of the eyelet 12 which implies a disk shape. The stem 10 is connected to a reference potential (e.g., ground).

The stem 10 (eyelet 12) has a support surface 16 that supports the electronic components. The stem 10 has a pedestal portion 18 that integrally protrudes from the support surface 16. The pedestal portion 18 is also made of a conductor. A surface of the pedestal portion 18 is gold plated. The pedestal portion 18 has a tip face 20 in a protruding direction. The pedestal portion 18 has an upper surface 22 that extends along the protruding direction. Since the pedestal portion 18 is formed by pressing, its corners tend to be rounded and it is difficult to form a wide flat surface.

[Lead Pin]

As shown in FIG. 1, the optical module 100 has some lead pins L. The lead pins L are fixed inside the respective through holes 14, insulated from the stem 10 with a dielectric (insulator) such as glass. The lead pin L and the dielectric constitute a feedthrough. The lead pins L are connected to the flexible substrate 102 (FIG. 1).

[Photoelectric Device]

The optical module 100 has a photoelectric device 24. The photoelectric device 24 is configured to convert an optical signal and an electrical signal at least from one to another. A semiconductor laser 26 and an optical modulator 27 are integrated in the photoelectric device 24. A wire W1 is bonded to the semiconductor laser 26 to apply a DC voltage thereto. The optical modulator 27 is driven in a single-ended manner. The photoelectric device 24 is mounted on a mounting substrate 28.

[Mounting Substrate]

The mounting substrate 28 has a mounting surface on which the photoelectric device 24 is mounted. The photoelectric device 24 is disposed so as to direct an optical axis in a direction parallel to the mounting surface. The mounting substrate 28 has a first ground pattern 30 and a first signal pattern 32 on the mounting surface, as shown in FIG. 3.

The photoelectric device 24 has a back surface (electrode common to the semiconductor laser 26 and the optical modulator 27) bonded to the first ground pattern 30. The first ground pattern 30 is integrated with the first side electrode 34 to enable electrical connection on a side opposite to the mounting surface. The first signal pattern 32 is electrically connected to the photoelectric device 24 (optical modulator 27) with a wire W2 to input a high frequency signal. An unillustrated termination resistor may be provided on the mounting substrate 28 to prevent reflected waves of the modulated electrical signal with a high-frequency component from returning to the drive IC (not shown). The mounting substrate 28 is mounted on a support block 36.

[Support Block]

The support block 36 includes a main body and a conductive film covering a surface of the main body. The main body is made of material (ceramic) having excellent thermal conductivity, such as aluminum nitride, to improve heat dissipation. The support block 36 at least on its surface is made of a conductor. Alternatively, the support block 36 may be entirely made of a conductor such as a metal block. The mounting substrate 28 is opposed to the conductive film of the support block 36 to be electrically connected to each other.

A bypass capacitor 42 is mounted on the support block 36. The bypass capacitor 42 has a back surface (one electrode) electrically continuous to the support block 36 (conductive film) to be connected to a reference potential (e.g., ground). The bypass capacitor 42 has another electrode connected to a lead pin L1 through a wire W3 to apply a voltage thereto. The voltage is also connected to the photoelectric device 24 (semiconductor laser 26) through the wire W1 to supply a DC voltage. The high-frequency signal superimposed on the DC signal is separated by the bypass capacitor 42.

[Thermoelectric Cooler]

The optical module 100 has a thermoelectric cooler 44. The thermoelectric cooler 44 has an upper surface and a lower surface. The upper surface and the bottom surface are made of an insulator such as ceramic. The lower surface is fixed to the support surface 16 of the stem 10 (eyelet 12). A thermally conductive adhesive may be used for fixing. The upper surface and the mounting surface of the mounting substrate 28 face mutually intersecting (e.g., perpendicular) directions, as shown in FIG. 2. The thermoelectric cooler 44 has a Peltier device (not shown) inside for transferring heat between the upper surface and the lower surface. For example, the upper surface is a heat-absorbing surface and the lower surface is a heat-dissipating surface, or vice versa depending on switching. The thermoelectric cooler 44 has an electrode connected to the lead pins L2 with wires W4.

A metal layer 46 (FIG. 2) is laminated to the upper surface of the thermoelectric cooler 44. The metal layer 46 serves as a reference potential plane (e.g., ground plane). A thermistor 48 rests on the metal layer 46 to be electrically connected, enabling measurement of temperature. The thermistor 48 is connected to the lead pin L3 with a wire W5, to apply a voltage thereto.

The thermoelectric cooler 44 is fixed between the support surface 16 of the stem 10 and the support block 36 to transfer heat between them. The support block 36 is supported by the support surface 16 of the stem 10 via the thermoelectric cooler 44. The support block 36 is fixed to the upper surface of the thermoelectric cooler 44 and is electrically connected to the metal layer 46.

[Relay Board]

A relay board 50 is mounted on the upper surface 22 of the pedestal portion 18 of the stem 10. Solder (not shown) is used to secure them and is likely to overflow from under the relay board 50. The pedestal portion 18 protrudes from the relay board 50 in the protruding direction.

The relay board 50 has a second signal pattern 52, as shown in FIG. 3. The second signal pattern 52 is electrically connected to the lead pin L4. In detail, a filler metal 54 (solder, brazing material) is interposed between an end of the lead pin L4 and a terminal of the second signal pattern 52 to electrically connect them.

The second signal pattern 52 is connected to the first signal pattern 32 with wires W6. The relay board 50 has a second ground pattern 56. The second ground pattern 56 is integrated with the second side electrode 58 to enable electrical connection at a back side and is electrically connected to the pedestal portion 18. The second ground pattern 56 is also connected to the support block 36 with wires W7.

[Connection Block]

Figure 4:
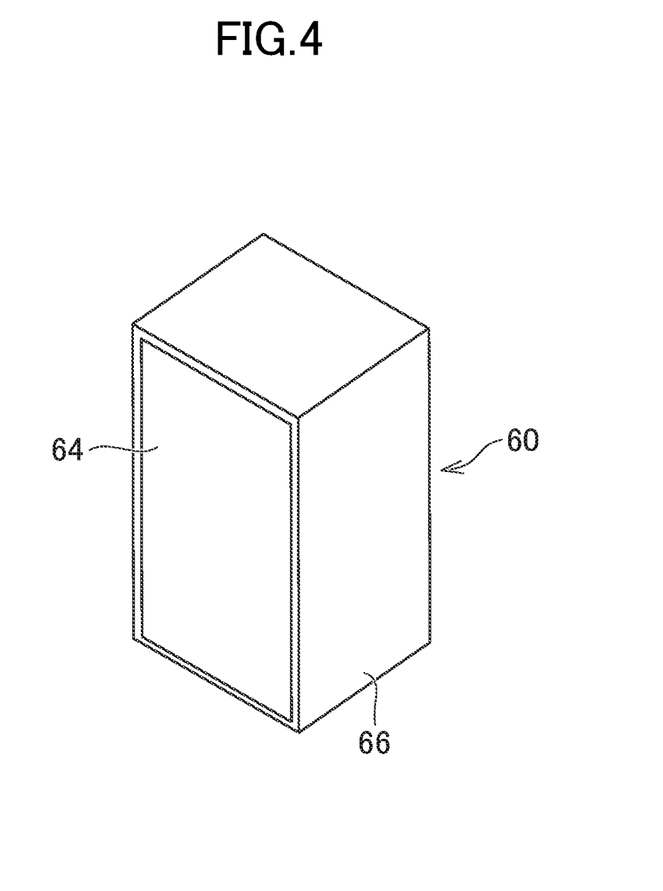
FIG. 4 is a perspective view of a connection block.

FIG. 4 is a perspective view of a connection block 60. The connection block 60 is fixed to the tip face 20 of the pedestal portion 18. A conductive adhesive 62 or a filler metal is used for fixing. At least a portion of the surface of the connection block 60 is made of a conductor. The connection block 60 includes a body 64 made of ceramic and a conductive film 66 covering the body 64. The connection block 60 is lower in thermal conductivity than the stem 10. The connection block 60 may be entirely formed from metal, but it is easier and less costly to form the body 64 from ceramic.

The connection block 60 has a first bonding surface 68. The first bonding surface 68 faces the same direction as the tip face 20 of the pedestal portion 18. The first bonding surface 68 is a flat surface. The first bonding surface 68 is larger in length along a vertical direction (up and down direction in FIG. 2) than in width perpendicular thereto.

The connection block 60 has a second bonding surface 70. The second bonding surface 70 faces the same direction as the upper surface 22 of the pedestal portion 18. The second bonding surface 70 is a flat surface. The second bonding surface 70 is higher in position than the upper surface 22 of the pedestal portion 18. The second bonding surface 70 is larger in length along a vertical direction (protruding direction of the pedestal portion 18) than in width perpendicular thereto.

[Wire]

The optical module 100 has some wires 72 in addition to the wires W1 to W7 described above. Each of the wires 72 connects the support block 36 or the mounting substrate 28 to the connection block 60.

At least one first wire 74 has one end bonded to the first bonding surface 68. The at least one first wire 74 has another end bonded to the support block 36. The first wires 74 are bonded to some first positions arranged in a row on the first bonding surface 68, as shown in FIG. 2. The direction in which the first positions are arranged is the vertical direction of the first bonding surface 68.

At least one second wire 76 has one end bonded to the second bonding surface 70. The at least one second wire 76 has another end bonded to the mounting substrate 28 (first ground pattern 30). The second wires 76 are bonded to some second positions arranged in a row on the second bonding surface 70, as shown in FIG. 2. The direction in which the second positions are arranged is the vertical direction of the second bonding surface 70.

When the solder (not shown) fixing the relay board 50 overflows on the upper surface 22 of the pedestal portion 18, the wire bonding area of the pedestal portion 18 becomes narrow. However, in the present embodiment, by providing the connection block 60, the wire bonding area can be secured and stable wire bonding can be performed. In addition, the protruding length of the pedestal portion 18 can be shortened, and since it is not necessary to secure a wide flat surface, there is no need to increase the processing accuracy.

Second Embodiment

Figure 5:
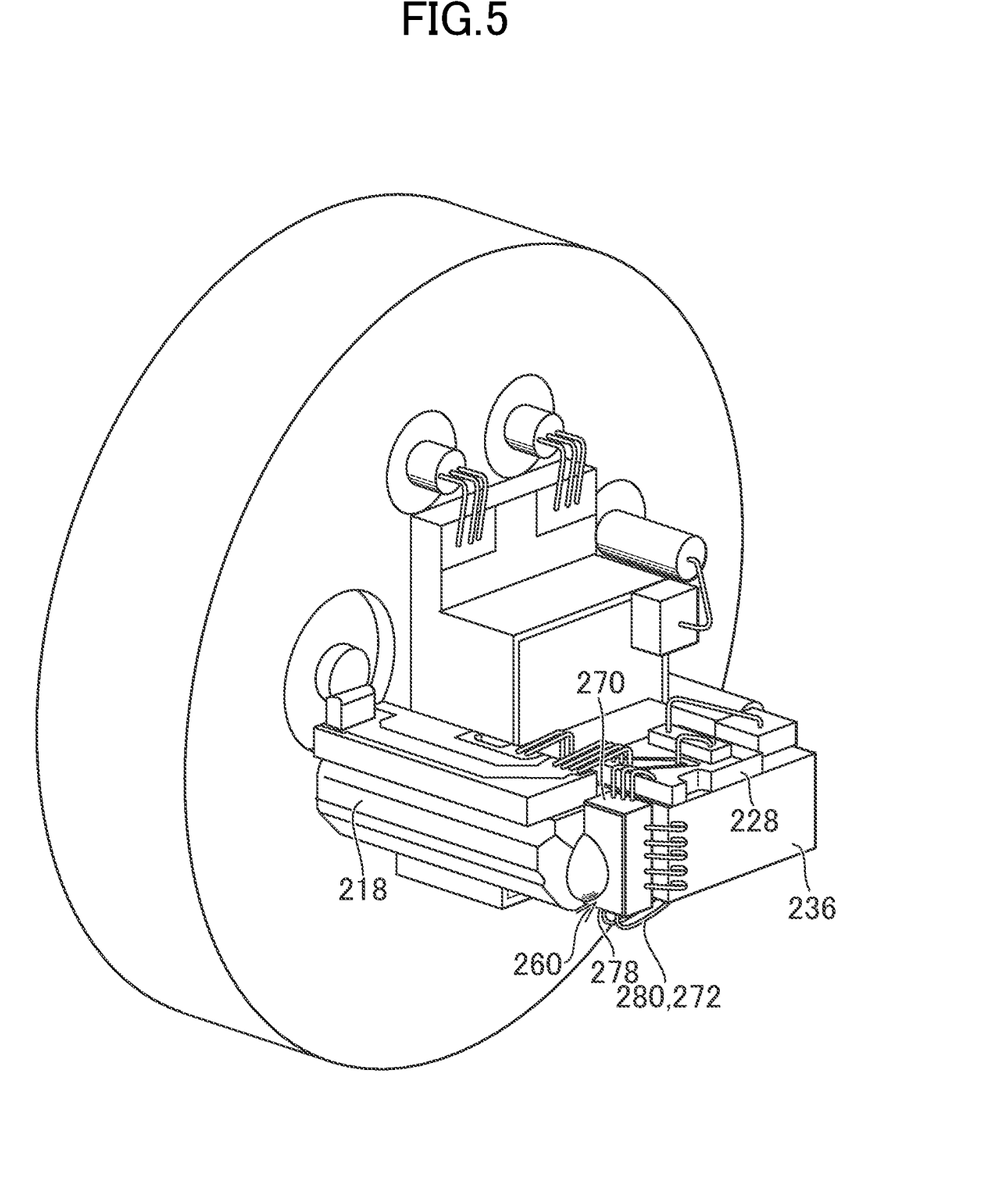
FIG. 5 is a perspective view of a stem and electronic components mounted on it according to a second embodiment.
Figure 6:
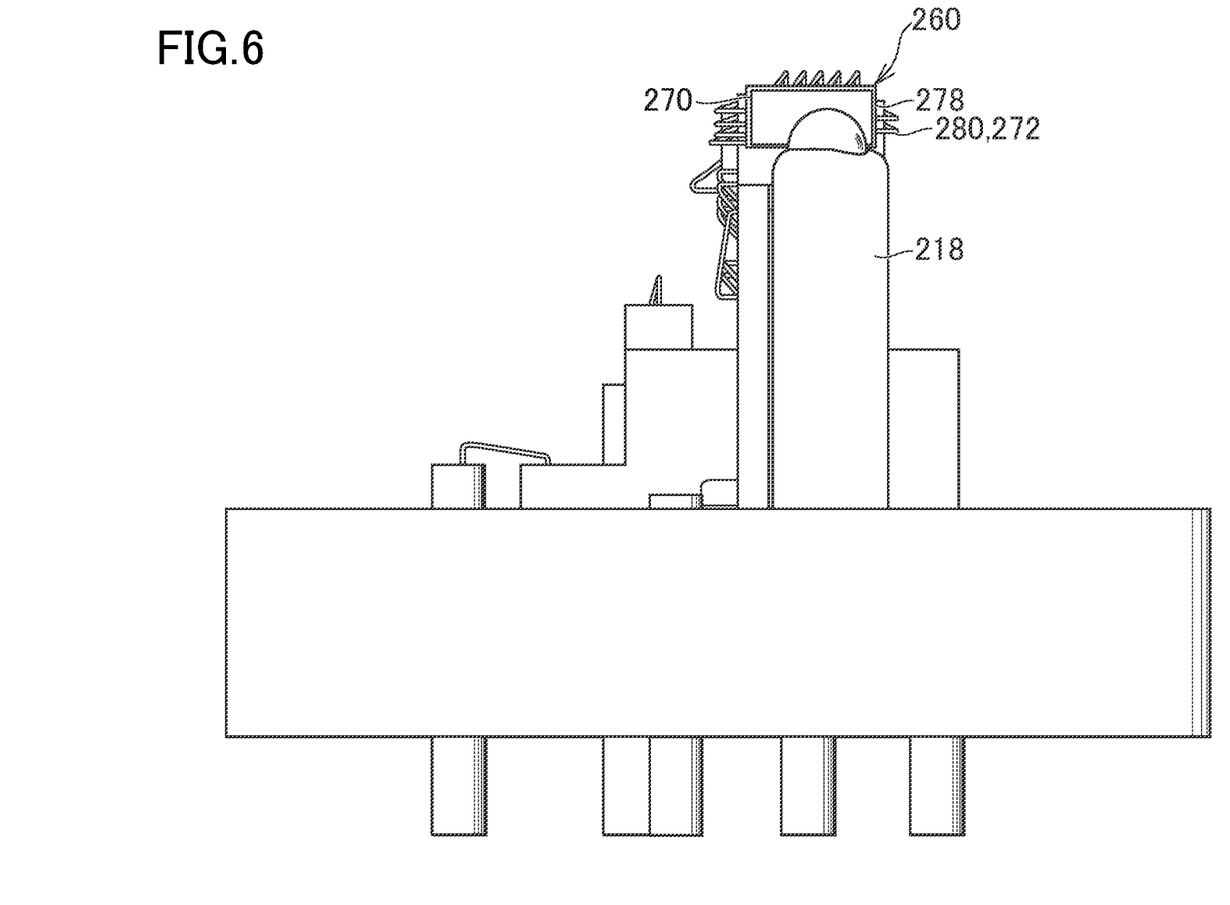
FIG. 6 is a side view of the stem and the electronic components mounted on it.
Figure 7:
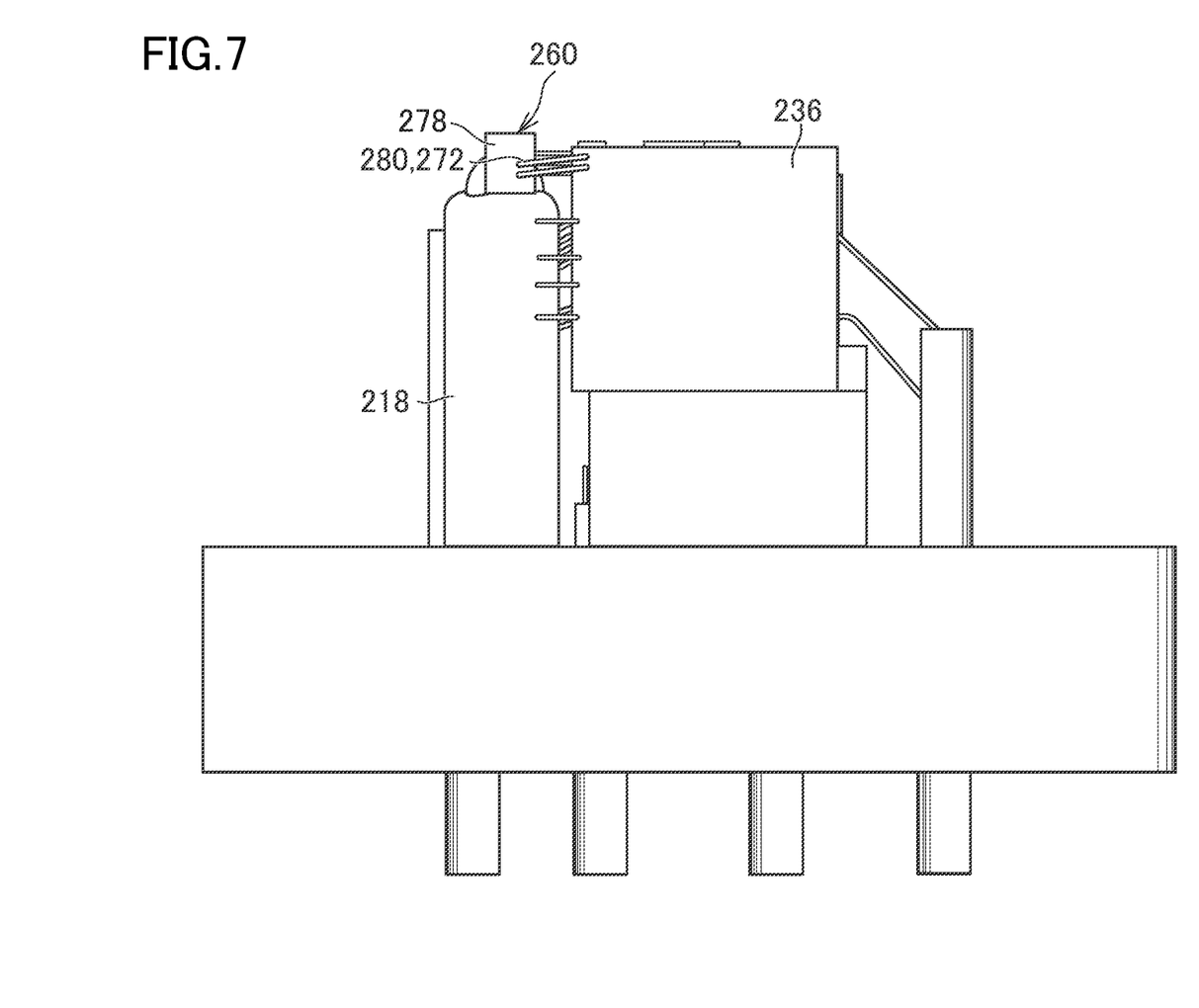
FIG. 7 is a bottom view of the stem and the electronic components mounted on it.

FIG. 5 is a perspective view of a stem and electronic components mounted on it according to a second embodiment. FIG. is a side view of the stem and the electronic components mounted on it. FIG. 7 is a bottom view of the stem and the electronic components mounted on it.

The connection block 260 has a third bonding surface 278 opposite to the second bonding surface 270. The third bonding surface 278 is a flat surface. The third bonding surface 278 is larger in length along a vertical direction (protruding direction of the pedestal 218) than in width perpendicular thereto.

The wires 272 includes at least one third wire 280 having one end bonded to the third bonding surface 278. The at least one third wire 280 has another end bonded to the support block 236 (e.g., back surface thereof). The third wires 280 are bonded to some third positions arranged in a row on the third bonding surface 278. The direction in which the third positions are arranged is the vertical direction of the third bonding surface 278.

The third wire 280 connects the pedestal portion 218 to the support block 236 (alternatively, mounting substrate 228). This enables ground reinforcement of the support block 236 (alternatively, mounting substrate 228) and enables signal transmission up to a high frequency. The contents described in the first embodiment can be applied hereto.

Figure 8:
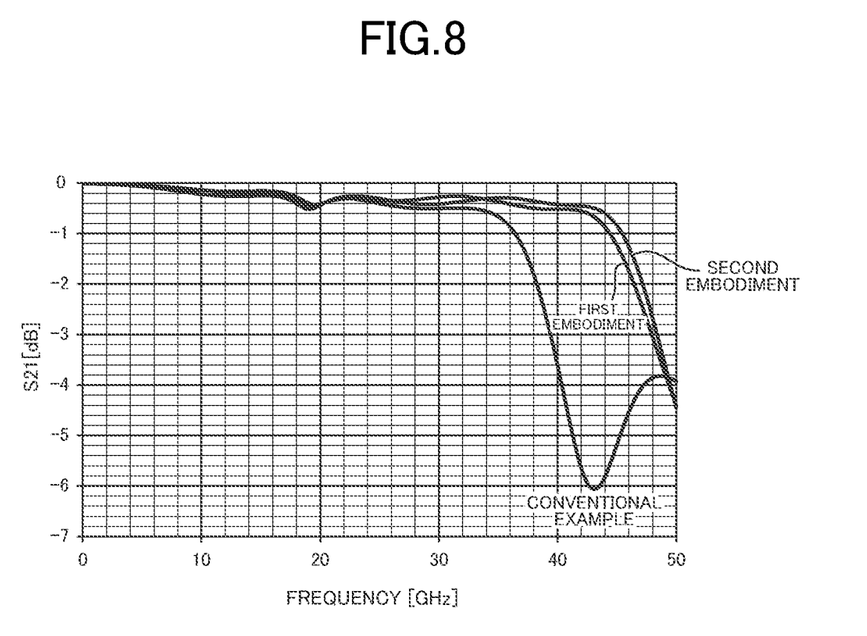
FIG. 8 is frequency characteristics of a conventional example, the first embodiment, and the second embodiment, calculated by a three-dimensional electromagnetic field simulator HFSS (High Frequency Structure Simulator).

FIG. 8 is frequency characteristics of a conventional example, the first embodiment, and the second embodiment, calculated by a three-dimensional electromagnetic field simulator HFSS (High Frequency Structure Simulator). In the conventional example, no connection block was provided.

Compared with the conventional example, the first embodiment where a wide bonding area is secured improves transmission characteristics especially at 40 GHz or higher. The second embodiment further improves the transmission characteristics.

Outline of the Embodiments (1) An optical module 100 including: a photoelectric device 24 configured to convert an optical signal and an electrical signal at least from one to another; a mounting substrate 28 on which the photoelectric device 24 is mounted; a support block 36 on which the mounting substrate 28 is mounted and at least a surface of which is made of a conductor; and a stem 10 having a support surface 16 to support the support block 36, the stem 10 having a pedestal portion 18 projecting integrally from the support surface 16, the pedestal portion 18 having a tip face 20 in a protruding direction and an upper surface 22 spreading along the protruding direction; a relay board 50 mounted on the upper surface 22 of the pedestal portion 18; a connection block 60 fixed to the tip face 20 of the pedestal portion 18; and some wires 72, each of the wires 72 connecting a corresponding one of the support block 36 and the mounting substrate 28 to the connection block 60, the connection block 60 having a surface at least part of which is made of a conductor, the connection block 60 having a first bonding surface 68 facing the same direction as the tip face 20 of the pedestal portion 18 and a second bonding surface 70 facing the same direction as the upper surface 22, the wires 72 including at least one first wire 74 having one end bonded to the first bonding surface 68 and at least one second wire 76 having one end bonded to the second bonding surface 70.

(2) The optical module 100 according to (1), wherein the at least one first wire 74 has another end bonded to the support block 36, and the at least one second wire 76 has another end bonded to the mounting substrate 28.

(3) The optical module 100 according to (1) or (2), wherein the at least one first wire 74 includes first wires 74, and the first wires 74 are bonded to some first positions arranged in a row on the first bonding surface 68.

(4) The optical module 100 according to (3), wherein the first bonding surface 68 is larger in length along a direction in which the first positions are arranged than in width perpendicular to the length.

(5) The optical module 100 according to any one of (1) to (4), wherein the at least one second wire 76 includes second wires 76, and the second wires 76 are bonded to some second positions arranged in a row on the second bonding surface 70.

(6) The optical module 100 according to (5), wherein the second bonding surface 70 is larger in length along a direction in which the second positions are arranged than in width perpendicular to the length.

(7) The optical module 100 according to any one of (1) to (6), wherein the pedestal portion 18 protrudes from the relay board 50 in the protruding direction.

(8) The optical module 100 according to any one of (1) to (7), wherein the second bonding surface 70 of the connection block 60 is higher in position than the upper surface 22 of the pedestal portion 18.

(9) The optical module 100 according to any one of (1) to (8), wherein each of the first bonding surface 68 and the second bonding surface 70 is a flat surface.

(10) The optical module 100 according to any one of (1) to (9), wherein the connection block 60 includes a main body 64 made of ceramic and a conductive film 66 covering the main body 64.

(11) The optical module 100 according to any one of (1) to (10), wherein the support block 36 includes a main body made of ceramic and a conductive film covering the main body 64.

(12) The optical module 100 according to any one of (1) to (11), wherein the connection block 60 is lower in thermal conductivity than the stem 10.

(13) The optical module 100 according to any one of (1) to (12), further comprising a conductive adhesive 62 or a filler metal to secure the connection block 60 and the pedestal portion 18.

(14) The optical module 100 according to any one of (1) to (13), further comprising a thermoelectric cooler 44 fixed between the support surface 16 of the stem 10 and the support block 36 and configured to transfer heat.

(15) The optical module according to any one of (1) to (14), wherein the connection block 260 has a third bonding surface 278 opposite to the second bonding surface 270, and the wires 272 include at least one third wire 280 having one end bonded to the third bonding surface 278.

(16) The optical module according to (15), wherein the at least one third wire 280 has another end bonded to the support block 236.

(17) The optical module according to (15) or (16), wherein the third bonding surface 278 is a flat surface.

(18) The optical module according to (16) or (17), wherein the at least one third wire 280 includes third wires 280, and the third wires 280 are bonded to some third positions arranged in a row on the third bonding surface 78.

(19) The optical module according to (18), wherein the third bonding surface 278 is larger in length along a direction in which the third positions are arranged than in width perpendicular to the length.

The embodiments described above are not limited and different variations are possible. The structures explained in the embodiments may be replaced with substantially the same structures and other structures that can achieve the same effect or the same objective.

What is claimed is:

1. An optical module comprising:
   a photoelectric device configured to convert an optical signal and an electrical signal at least from one to another;
   a mounting substrate on which the photoelectric device is mounted;
   a support block on which the mounting substrate is mounted and at least a surface of which is made of a conductor;
   a stem having a support surface to support the support block, the stem having a pedestal portion projecting integrally from the support surface, the pedestal portion having a tip face in a protruding direction and an upper surface spreading along the protruding direction;
   a relay board mounted on the upper surface of the pedestal portion;
   a connection block fixed to the tip face of the pedestal portion; and
   a plurality of wires, each wire of the plurality of wires connecting a corresponding one of the support block or the mounting substrate to the connection block,
   the connection block having a first bonding surface facing a same direction as the tip face of the pedestal portion, and a second bonding surface facing a same direction as the upper surface, and
   the plurality of wires including at least one first wire having one end bonded to the first bonding surface and at least one second wire having one end bonded to the second bonding surface.

2. The optical module according to claim 1, wherein
   the at least one first wire has another end bonded to the support block, and
   the at least one second wire has another end bonded to the mounting substrate.

3. The optical module according to claim 1, wherein
   the at least one first wire includes a plurality of first wires, and
   first wires of the plurality of first wires are bonded to first positions, respectively, arranged in a row on the first bonding surface.

4. The optical module according to claim 3, wherein the first bonding surface is larger in length along a direction in which the first positions are arranged than in width perpendicular to the length.

5. The optical module according to claim 1, wherein
   the at least one second wire includes a plurality of second wires, and
   second wires of the plurality of second wires are bonded to second positions, respectively, arranged in a row on the second bonding surface.

6. The optical module according to claim 5, wherein the second bonding surface is larger in length along a direction in which the second positions are arranged than in width perpendicular to the length.

7. The optical module according to claim 1, wherein the pedestal portion protrudes from the relay board in the protruding direction.

8. The optical module according to claim 1, wherein the second bonding surface of the connection block is higher in position than the upper surface of the pedestal portion.

9. The optical module according to claim 1, wherein each of the first bonding surface and the second bonding surface is a flat surface.

10. The optical module according to claim 1, wherein the connection block includes a main body made of ceramic and a conductive film covering the main body.

11. The optical module according to claim 1, wherein the support block includes a main body made of ceramic and a conductive film covering the main body.

12. The optical module according to claim 1, wherein the connection block is lower in thermal conductivity than the stem.

13. The optical module according to claim 1, further comprising a conductive adhesive or a filler metal to secure the connection block and the pedestal portion.

14. The optical module according to claim 1, further comprising a thermoelectric cooler fixed between the support surface of the stem and the support block, and configured to transfer heat.

15. The optical module according to claim 1, wherein
   the connection block has a third bonding surface opposite to the second bonding surface, and
   the plurality of wires includes at least one third wire having one end bonded to the third bonding surface.

16. The optical module according to claim 15, wherein the at least one third wire has another end bonded to the support block.

17. The optical module according to claim 15, wherein the third bonding surface is a flat surface.

18. The optical module according to claim 16, wherein
   the at least one third wire includes a plurality of third wires, and
   third wires of the plurality of third wires are bonded to third positions, respectively, arranged in a row on the third bonding surface.

19. The optical module according to claim 18, wherein the third bonding surface is larger in length along a direction in which the third positions are arranged than in width perpendicular to the length.

* * * * *